United States Patent
Rueger et al.

(10) Patent No.: US 7,262,555 B2
(45) Date of Patent: Aug. 28, 2007

(54) METHOD AND SYSTEM FOR DISCRETELY CONTROLLABLE PLASMA PROCESSING

(75) Inventors: Neal R. Rueger, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/083,433

(22) Filed: Mar. 17, 2005

(65) Prior Publication Data
US 2006/0208649 A1 Sep. 21, 2006

(51) Int. Cl.
*H01J 7/24* (2006.01)
*B44C 1/22* (2006.01)

(52) U.S. Cl. ............... 315/111.21; 315/111.81; 216/67; 427/569

(58) Field of Classification Search .......... 315/111.21, 315/111.81; 216/63, 67; 427/569
See application file for complete search history.

(56) References Cited

U.S. PATENT DOCUMENTS

| | | | | |
|---|---|---|---|---|
| 4,684,848 A * | 8/1987 | Kaufman et al. | ...... | 315/111.81 |
| 4,749,910 A | 6/1988 | Hara et al. | ...... | 315/111.81 |
| 5,397,958 A | 3/1995 | Araki et al. | ...... | 313/231.31 |
| 5,413,663 A | 5/1995 | Shimizu et al. | ...... | 156/345.4 |
| 5,476,182 A | 12/1995 | Ishizuka et al. | ...... | 216/68 |
| 5,539,274 A | 7/1996 | Araki et al. | ...... | 313/362.1 |
| 5,601,653 A | 2/1997 | Ito et al. | ...... | 118/723 FE |
| 5,616,368 A * | 4/1997 | Jin et al. | ...... | 427/535 |
| 5,639,308 A | 6/1997 | Yamazaki et al. | ...... | 118/723 FE |
| 5,841,235 A * | 11/1998 | Engelko et al. | ...... | 315/111.21 |
| 5,874,807 A | 2/1999 | Neger et al. | ...... | 315/111.41 |
| 6,348,158 B1 | 2/2002 | Samukawa | ...... | 216/67 |
| 6,368,678 B1 * | 4/2002 | Bluck et al. | ...... | 427/569 |
| 6,624,584 B2 | 9/2003 | Schmidt-Boecking et al. | ...... | 315/111.81 |
| 6,650,061 B1 | 11/2003 | Urayama et al. | ...... | 315/169.3 |
| 6,700,127 B2 | 3/2004 | Schneiker et al. | ...... | 250/423 F |
| 7,005,660 B2 * | 2/2006 | Honda et al. | ...... | 250/492.3 |
| 7,023,002 B2 * | 4/2006 | Nagaseki et al. | ...... | 250/492.1 |
| 2002/0047544 A1 | 4/2002 | Nishikawa et al. | ...... | 315/111.21 |
| 2003/0090190 A1 | 5/2003 | Takai et al. | ...... | 313/311 |
| 2003/0224104 A1 | 12/2003 | Fukunaga et al. | ...... | 427/146 |
| 2004/0150312 A1 | 8/2004 | McElrath et al. | ...... | 313/310 |
| 2004/0248040 A1 * | 12/2004 | Mitsuoka et al. | ...... | 430/296 |

OTHER PUBLICATIONS

Zhao et al., Filed Emission from AlN Nanoneedle Arrays, Applied Physics Letters, vol. 85, No. 22, Nov. 29, 2004, pp. 5331-5333, China.
Cheng et al., Zinc Oxide Single-Crystal Microtubes, Applied Physics Letters, vol. 85, No. 22, Nov. 29, 2004, pp. 5140-5142, China.
Park et al., Fabrication and Photoluminescent Properties of ZnO/ZnMgO Quantum Structure Nanorods, Department of Material Science and Engineering, Puhang University of Science and Technology, Korea.

* cited by examiner

*Primary Examiner*—Thuy Vinh Tran
(74) *Attorney, Agent, or Firm*—TraskBritt (57) ABSTRACT

A method and system for plasma generation and processing includes a plurality of beam generators each locally controllable and configured for operation upon a single substrate. A control circuit couples to each of the plurality of beam generators with the control circuit configured to independently regulate at least a portion of the plurality of beam generators. A process gas is introduced into an area above a surface of a substrate. A plurality of beam generators is locally controlled and is directed at the process gas. The beam generators independently emit electrons as controlled and at least a portion of the process gas is converted into plasma according to the electrons emitted from the plurality of the independently controllable beam generators. The substrate is processed using the plasma according to local control of each of the plurality of beam generators.

25 Claims, 6 Drawing Sheets

METHOD AND SYSTEM FOR DISCRETELY CONTROLLABLE PLASMA PROCESSING

BACKGROUND OF THE INVENTION

1. Field of the Invention

The present invention pertains generally to plasma processing and, more particularly, to a system and method for discretely controlling a plasma process over discrete areas within a system.

2. State of the Art

Many processes utilize plasma as a form of modification to chemical and physical surfaces. Such surface modifications may include etching for the removal of surface material, treatment of a surface such as through the use of a plasma enhanced chemical vapor deposition, alterations and enhancements for ion implantation or other surface modification or preparation techniques known by those of ordinary skill in the art. Plasma systems have been developed which utilize a substantial distance between the plasma and the surface of the substrate undergoing a plasma process. However, improved plasma processes prefer a close proximity of the plasma with the surface to be processed which enhances the desired chemical reactions and reduces contamination and damage to process equipment. Conventional plasma systems may bias a substrate to form an electric field near the substrate or the backing plate supporting the substrate thereby enhancing an attraction and providing control of the ion density and ion energy.

Various types of plasma sources are known by those in the art, namely capacitively coupled, electron cyclotron resonance, helicon and inductively coupled sources. These various types of plasma sources have individual benefits and shortcomings. Regarding the capacitively coupled plasma source, the RF energy is capacitively coupled into a plasma which fills the entire processing chamber. In many conventional systems, such as capacitively coupled systems, the ion density and ion energy are undesirably intrinsically coupled, and therefore cannot be desirably independently controlled. While capacitively coupled RF reactors may produce a generally uniform plasma over a many square centimeter area, the same RF which produces the plasma also generates a bias voltage between the plasma and the surface undergoing processing. Therefore, the plasma density and the ion bombardment energy generally increases with the RF power injected into the plasma system. Therefore, adjustments to the density may be made by changing the gas density and the RF power level but such adjustments are limited since the single RF source produces both a plasma and bias voltage.

Some applications require higher ion density and ion energy than may be generally produced by capacitively coupled RF reactors. Electron cyclotron resonance, helicon, and inductively coupled plasma sources may provide higher densities and energies. Such generators generally decouple or separate plasma generation from the generation of ion energy relating to the ion bombardment of the process surface. While these plasma sources may separate the control and formation of ion density and ion energy, such plasma sources lack uniformity across a particular surface area. Additionally, such approaches generate large volumes of plasma outside of the processing region and shower surrounding surfaces with ion bombardment.

The various aforementioned plasma sources and the resulting plasma generated therein are influenced by many variables including the source type, the processing chamber dimensions, the gas density and uniformity, as well as other variables known by those of ordinary skill. In order to obtain a desired plasma condition, many variables must be managed and various processes must endure processing tradeoffs. It should be apparent that as specific devices become miniaturized and the associated substrates increase in area and dimensions, there is a need to provide more uniformity for a process across an entire or majority of the surface area being processed. Additionally, there are needs for providing a controllably varied process across a substrate by managing regional or localized processes across a spatial dimension of a substrate.

BRIEF SUMMARY OF THE INVENTION

A method and system for plasma generation and processing is provided. In one embodiment of the present invention, a plasma processing system is provided. The system includes a plurality of beam generators each locally controllable and configured for operation upon a portion of a single substrate. The system further includes a control circuit coupled to each of the plurality of beam generators with the control circuit configured to independently regulate at least a portion of the plurality of beam generators.

In yet another embodiment of the present invention, a plasma processing method is provided. The plasma processing method introduces a process gas into an area above a surface of a substrate. A plurality of beam generators is locally controlled and is directed at the process gas. The beam generators independently emit electrons as controlled and at least a portion of the process gas is converted into plasma according to the electrons emitted from the plurality of beam generators. The substrate is processed using the plasma according to local control of each of the plurality of beam generators.

In yet a further embodiment of the present invention, a plasma processing method is provided. An array of electron beam generators is independently controlled according to a profile. A process gas is introduced into an area above a surface of the substrate and at least a portion of the process gas is converted into plasma. The substrate is then processed according to the plasma.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The various embodiments of the present invention employ the application of electron beam generated plasma for the plasma processing of various surfaces. In accordance with the various embodiments of the present invention, a plurality of electron beams are utilized for the generation of the plasma. The plurality of electron beams are arranged and configured to be programmable on either an individual basis or as collectively arranged groups for regulating a localized electron beam region and forming localized regions for the specific control of plasma and the resulting effects thereof. Accordingly, the localized region for the electron energy and electron density may be locally regulated and controlled.

Figure 1:
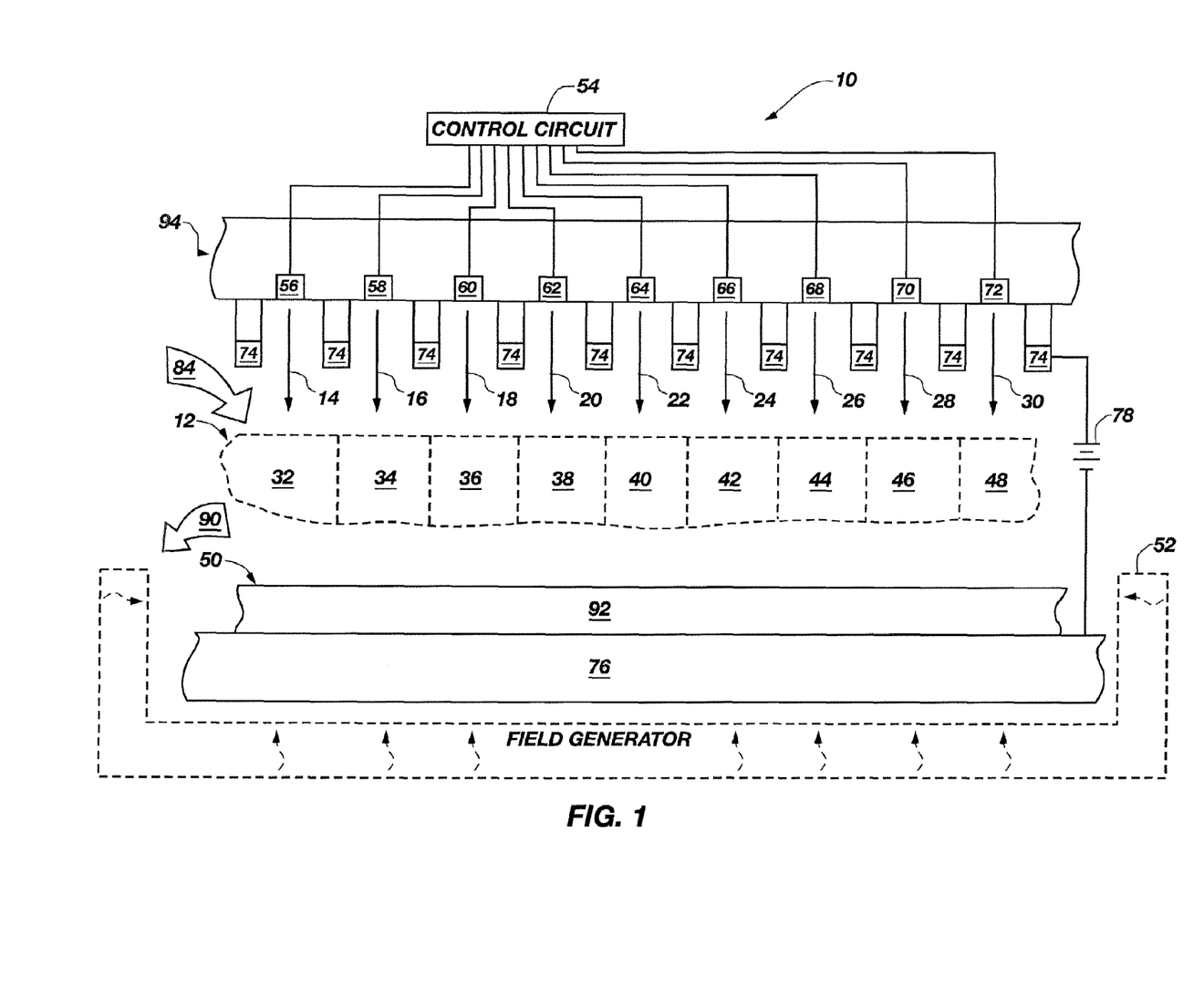
FIG. 1 is a block diagram of a plasma processing system, in accordance with an embodiment of the present invention.

FIG. 1 illustrates a locally controllable plasma processing system 10, in accordance with an embodiment of the present invention. The various disclosed embodiments of the present invention provide a method and system for the generation of a locally variable plasma 12 which may exhibit variations in ion density and ion energy across a lateral cross-section of the locally variable plasma. The locally adjustable control within the plasma processing system 10 enables a wide range of customization and optimization for diverse plasma processes. The locally controllable capabilities of the plasma processing system 10 enables the formation of a uniform distribution of plasma in view of variations in gas flow and gas concentration variations as well as cumulative ion generation and bombardment. Additionally, the locally controllable capabilities of the plasma processing system 10 further enables the formation of a selectable non-uniform distribution of the plasma for non-uniform plasma processing of a substrate. Furthermore, the locally controllable nature of the plasma processing system 10 further accommodates variations in boundary conditions associated with ion bombardment of adjacent structures and gas depletion issues associated with the inherent geometrical constraints within the plasma processing system 10.

Generally, the plasma processing system 10 includes a source assembly 94 and is configured to produce a plurality of beams 14-30 which contributes to the formation of the locally variable plasma 12 over a predefined area within the plasma processing system 10. The locally variable plasma 12 may be formed to be spatially uniform across a lateral cross-section or may be configured according to a selected or desired profile across the same lateral cross-section. Therefore, the locally variable plasma 12 includes a plurality of local plasma regions 32-48 which may individually exhibit variations in ion density and ion energy. The locally variable plasma 12 may be modified according to the desired processing specifications through variations in energy applied to each of the beams 14-30 as well as the proximity of beams 14-30 to a surface under process 50 of a substrate 92. Additionally, the strength of an applied electrical field across the locally variable plasma 12 also contributes to the resultant ion densities and ion energy exhibited upon the surface under process 50.

Specifically, the plurality of beams 14-30 configured to cooperatively produce locally variable plasma 12 may be configured as individually controllable beam sources (e.g., electron beams) which are individually adjustable from a control circuit 54. The control circuit 54 may be under the discrete control of a computer control system (not shown) which may individually regulate the specific electrical conditions for the generation of beams 14-30. The beams 14-30 are respectively generated by a corresponding array of beam generators 56-72. The plurality of beam generators are spatially configured in a spatial array for spatially extending across at least a major portion of a surface under process of a substrate. By way of example and not limitation, the beam generators 56-72 may be configured as electron beam generators and may be constructed according to various technologies. Again by way of example and not limitation, one acceptable construction of beam generators 56-72 includes the formation of an electron source through the formation of microscopic hollow cathode emitters with electron extraction elements, single walled or multi-walled carbon nanotubes, boron carbon nitride (BCN) nanotubes, AlN nanoneedles, or ZnO single crystal microtubes, as well as other configurations and structures configured as field emitter elements.

By way of example and not limitation, carbon nanotubes, and more particularly, single walled carbon nanotubes are hollow, tubular fullerene molecules consisting essentially of hybrid carbon atoms typically arranged in hexagons and pentagons. Single-walled carbon nanotubes typically have diameters between approximately 0.5-3.5 nanometers with lengths generally greater than 50 nanometers. Carbon nanotubes are known for their excellent electrical and thermal conductivity and high tensile strength. Multi-walled carbon nanotubes generally are configured as nested single-walled carbon cylinders. The quantity of walls in a multi-walled carbon nanotube may be as few as two and as many as hundreds.

AlN nanoneedles find application as an emitter option since AlN nanoneedles favorably function as field emitters due to their very small or even negative electron affinity. Such a small electron affinity means that an electron can be extracted from the surface easily when an electric field is applied, which results in a large field-emission current density. One AlN nanoneedle fabrication technique is discussed in "Field Emission From AlN Nanoneedle Arrays," Applied Physics Letters, vol. 85, no. 22 (29 Nov. 2004), which is incorporated herein by reference.

Similarly, ZnO microtubes find application as field emitters due to their excellent electron emission at room temperature. ZnO microtubes exhibit strong near-band-edge emission and excellent electron field emission including respectable emission current density. ZnO microtube fabrication technique is discussed in "Zinc Oxide Single-Crystal Microtubes." Applied Physics Letters, vol. 85, no. 22 (29 Nov. 2004), which is incorporated herein by reference.

The plasma processing system 10 further includes a grid 74, which functions as an electrically conductive plate across which a potential is formed by an electrical potential generator 78, which is placed to accelerate the electrons emitted from the beam generators 56-72 and to protect the tips of the beam generators 56-72 from damage. The grid 74, in one exemplary embodiment, is an electrically conductive continuous grid maintained at a continuous potential across the grid structure. The potential maintained between the grid 74 and a plate 76 induces electron flow from the beam generators 56-72 toward the surface 50. In other embodiments, grid 74 may be configured as a plurality of discretely configured elements that are configured to exhibit discretely controllable potentials with respect to plate 76. As illustrated with reference to FIG. 1, the grid 74 is spatially configured between the beam generators 56-72 and the surface 50 to induce electron movement and protect the beam generators from damage. As illustrated, the electrical potential creating a field generated between grid 74 and plate 76 by electrical potential generator 78 induces electron flow during to the generation of electrons with the electrons directed toward the surface under process 50.

The presence of a steady state field resulting from the generated potential imposed along the direction of the beams 14-30 permits continuous operation in the presence of an adequate reactant concentration within a gas supply. FIG. 1 illustrates an embodiment of a plasma processing system where gas is supplied through a gas inlet 84 for the formation of local plasma regions 32-48 of the locally variable plasma 12. Once the reactants in the gas supply become adequately depleted, the exhaust gas is retrieved through a gas outlet 90 allowing the replenishment of a fresh gas supply. In a conventional arrangement, the gas supply may be continuously replenished and exhausted or may, alternatively, be periodically replenished.

According to the general principles of operation of the plasma processing system and in accordance with an embodiment of the present invention, plasma may be generated from, for example, argon process gas introduced into a chamber (not shown) and in the presence of electrons released by the beam generators. Within the chamber, an electrical field is generated between grid 74 and plate 76 to further accelerate electrons generated by the beam generators 56-72. The electron beams are irradiated upon the process gas introduced into the chamber causing generation of plasma. Within the chamber, the substrate is placed on a base such as plate 76 in a direction that is generally perpendicular to the irradiation direction of the electron beams. Therefore, processes such as etching or other surface modifications may occur on the surface under process 50 of the substrate 92.

Additionally, the plasma processing system 10 may further include a field generator 52 configured to project a field over the region of processing, and particularly, over the substrate 92. By way of example and not limitation, a magnetic field may be generated and asserted about the region of the substrate 92. A bulk magnetic field may be generated from beneath, above and around the region of the substrate 92. Exemplary field generators may be configured as north-south rotating magnets positioned below substrate 92, magnetic poles positioned in a circular pattern around and just above the region of substrate 92 (i.e., forming a "magnetic bucket"), electromagnetic field generation from electrically energized coils, etc. Furthermore, the magnetic field may be stable or sustained or the field may be temporally and spatially variable. It should be noted that the presence of a magnetic field is not essential, but provides an additional dimension of influence for the generation and affect of plasma.

Figure 2:
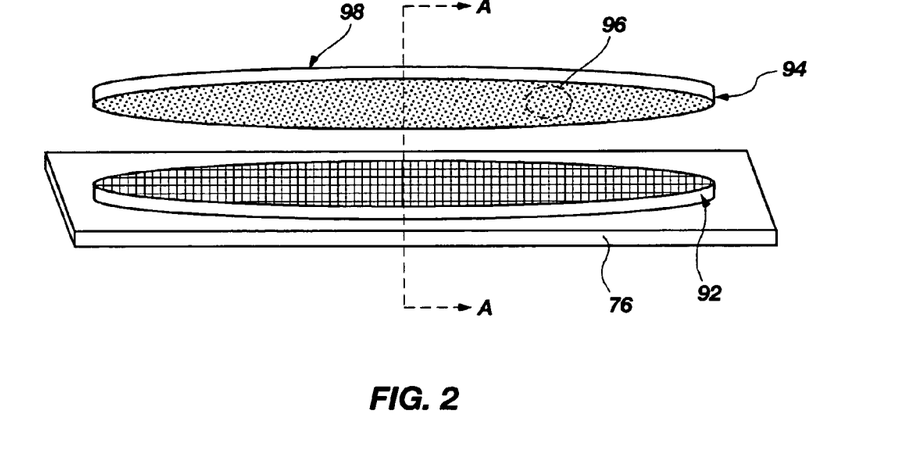
FIG. 2 is a perspective view of an electron beam array arranged for plasma processing of a surface, in accordance with various embodiments of the present invention.

FIG. 2 is a perspective view of a portion of the various embodiments of plasma processing systems, in accordance with the present invention. The illustrated portion includes a source assembly 94 for cooperatively generating plasma for the processing of the substrate 92 which is positioned about a plate 76. The source assembly 94 includes a plurality of beam generators 96 fabricated thereon. By way of example and not limitation, the plurality of beam generators 96 may be fabricated onto source assembly 94 according to a series of processes that generate one or more forms of the electron source types described hereinabove, namely, microscopic hollow cathode emitters with electron extraction elements, single walled or multi-walled carbon nanotubes, boron carbon nitride (BCN) nanotubes, AlN nano-needles, or ZnO single crystal microtubes, as well as other types which act as field emitter elements. As illustrated, the plurality of beam generators 96 may be configured in an array for providing localized or discrete beam generation across a desired area. In one or more various embodiments of the present invention as illustrated with respect to FIGS. 4 and 5, the source assembly 94 may further include gas inlet openings and/or gas outlet openings (not shown in FIG. 2). The source assembly 94 may further include a control grid or an interconnection on a layer 98 for individually controlling the plurality of beam generators 96. Layer 98 may be located on either an exterior surface of source assembly 94 or on a layer internal to source assembly 94.

With regard to the portion of the plasma processing system 10 (FIG. 1) illustrated in FIG. 2, the partial plasma processing system 10 is configured to interface and perform a plasma process on a substrate 92 configured to be subjected to the ion bombardment as generated by the source assembly 94. In one or more of the various exemplary embodiments, the substrate 92 may be configured as a semiconductor wafer having discrete integrated circuits fabricated thereon which are configured to be subjected to one or more plasma processes, in accordance with the various embodiments of the present invention. The substrate 92 is supported by a plate 76 configured to provide physical support for the substrate 92 as well as electrical properties for cooperatively enhancing the electric field between the grid 74 on source assembly 94 and the substrate 92. FIG. 2 illustrates a cross-section A-A which is further illustrated with respect to the various embodiments of FIG. 3 and FIG. 5.

Figure 3:
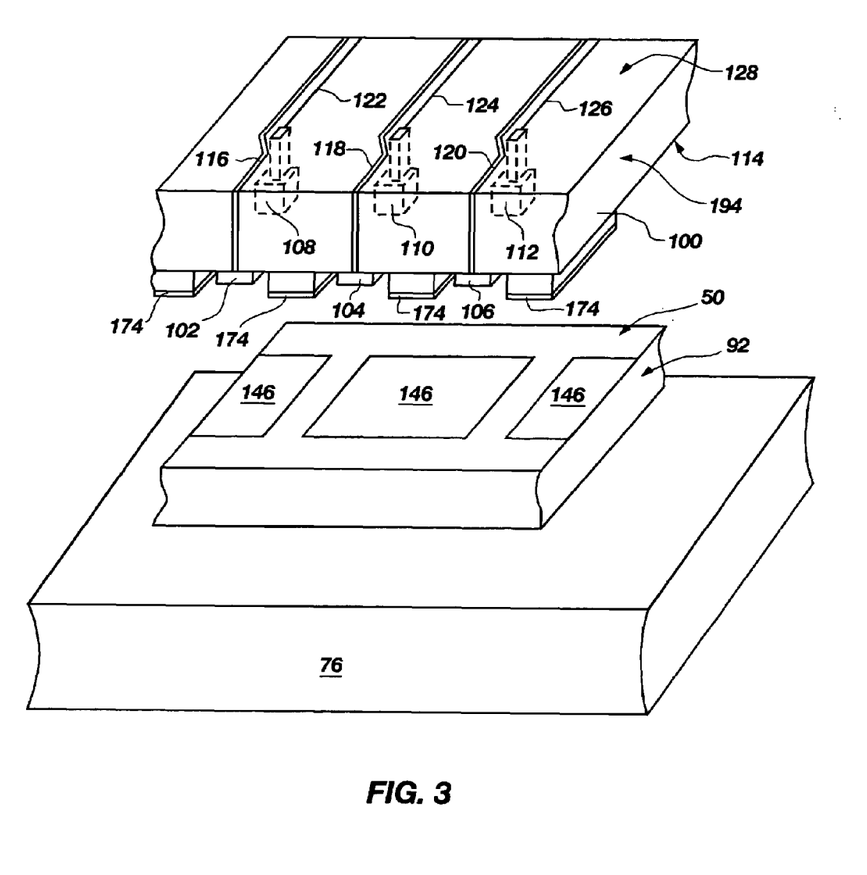
FIG. 3 is a partial cross-sectional view of FIG. 2, in accordance with an embodiment of the present invention.

FIG. 3 illustrates a partial cross-sectional area of the portion of the plasma processing system 10 (FIG. 1) as sectioned with reference to FIG. 2, in accordance with one embodiment of the present invention. Furthermore, the view as illustrated in FIG. 3 is a shortened cross-sectional view in order to enhance illustration and provide greater detail. In one embodiment of the present invention, the source assembly 194 includes a support structure illustrated as a substrate 100 configured to support and have formed therein the various other features of the source assembly 194. The substrate 100 may be configured as a generally planar semirigid or rigid material which is configured in a generally planar manner with respect to the surface under process 50 of the substrate 92. By way of example and not limitation, the substrate 100 may be configured as a semiconductor material upon which and/or through which the various other elements of the source assembly 194 may be fabricated in accordance with techniques known to those of ordinary skill in the semiconductor fabrication art.

Continuing the present example, the source assembly 194 further includes a plurality of beam generators 102-112 formed upon a first surface 114 of substrate 100. The first surface 114 of substrate 100 is configured for facing the surface under process 50 of the substrate 92. By way of example and not limitation, beam generators 102-112 may be configured as any one of a number of electron sources, examples of which were identified above, acting as field emitter elements.

Each of the beam generators 102-112 may be individually selectable and variably controllable through interconnects 116-126 for individually controlling each of the corresponding beam generators 102-112. While the present illustration depicts interconnects 116-126 passing through the substrate 100 and routed on a second surface 128 of substrate 100, such interconnects may be preferably routed on an internal layer within substrate 100 as fabricated according to conventional semiconductor wafer processing techniques. While the present example illustrates routing on a side of the substrate 100 opposing the side on which the beam generators 102-112 are fabricated, such an illustration provides clarity and is not to be considered limiting.

The source assembly 194 further includes a grid 174 which functions as an electrically conductive plate from which an electrical potential may be generated to accelerate the electrons emitted from the beam generators 102-112 and to protect the tips of the beam generators 102-112 from damage. The grid 174, in one embodiment, is a continuous grid maintained at a continuous potential across the continuous grid structure. The potential maintained between the grid 174 and a plate 76 induces electron flow from the beam generators 102-112 toward the surface under process 50. In other embodiments, grid 174 may be configured as a plurality of discretely configured elements that are configured to exhibit discretely controllable potentials with respect to plate 76. As illustrated with reference to FIG. 3, the grid 174 is spatially configured between the beam generators 102-112 and the surface under process 50 to induce electron movement and protect the beam generators from damage. As illustrated, the electrical potential creating a field generated between grid 174 and plate 76 induces directionality of electrons directed toward the surface under process 50.

The plasma processing system 10 (FIG. 1) further includes as illustrated in FIG. 3 the plate 76 for providing both mechanical support for the substrate 92 and electrically conductive plate for cooperatively inducing an electrical field for directing the generated plasma toward the surface under process 50 of the substrate 92. By way of example and not limitation, substrate 92 may be configured as a semiconductor wafer undergoing one or more manufacturing processes and may have manufactured thereon one or more integrated circuits 146.

Figure 4:
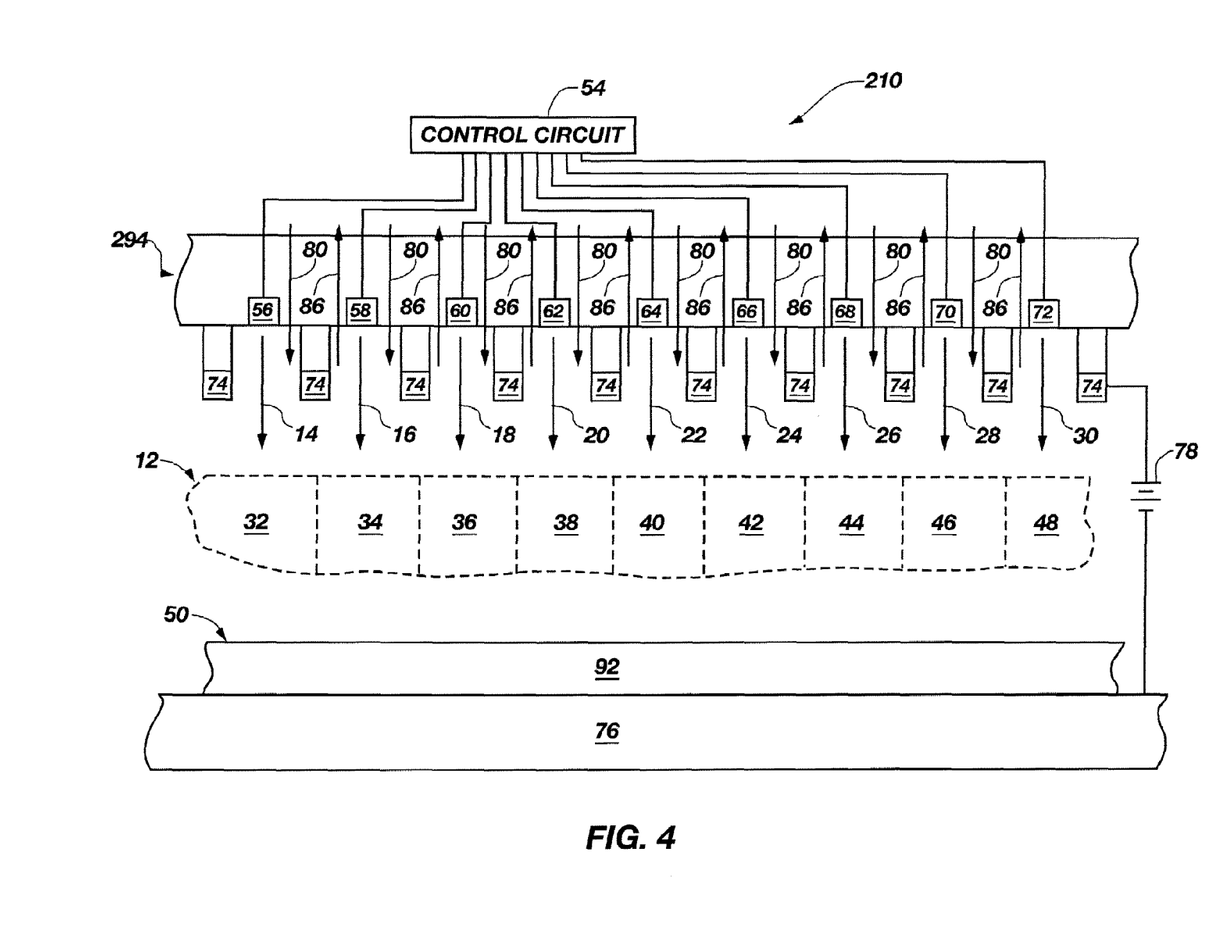
FIG. 4 is a block diagram of a plasma processing system, in accordance with another embodiment of the present invention.

FIG. 4 illustrates a locally controllable plasma processing system 210, in accordance with another embodiment of the present invention. In the present embodiment, an alternative gas exchange embodiment is illustrated for the generation of a locally variable plasma 12 which may exhibit variations in ion density and ion energy across a lateral cross-section of the locally variable plasma. Similarly, the plasma processing system 210 includes a source assembly 294 and is configured to produce a plurality of beams 14-30 which contributes to the formation of the locally variable plasma 12 over a predefined area within the plasma processing system 210. The locally variable plasma 12 may be formed to be spatially uniform across a lateral cross-section or may be configured according to a selected or desired profile across the same lateral cross-section. Therefore, the locally variable plasma 12 includes a plurality of local plasma regions 32-48 which may individually exhibit variations in ion density and ion energy. The locally variable plasma 12 may be modified according to the desired processing specifications through variations in energy applied to each of the beams 14-30 as well as the proximity of beams 14-30 to a surface under process 50. Additionally, the strength of an applied electrical field across the locally variable plasma 12 also contributes to the resultant ion densities and ion energy exhibited upon the surface under process 50 of substrate 92.

As previously stated, the plurality of beams 14-30 configured to cooperatively produce locally variable plasma 12 may be configured as individually controllable beam sources (e.g., electron beams) which are individually adjustable from the control circuit 54. The control circuit 54 may be under the discrete control of a computer control system (not shown) which may individually regulate the specific electrical conditions for the generation of beams 14-30. The beams 14-30 are respectively generated by corresponding beam generators 56-72. The plasma processing system 210 further includes a grid 74 spatially configured between the beam generators 56-72 and the surface 50 to induce electron movement according to a field generated by electrical potential generator 78 between grid 74 and plate 76.

The presence of a steady state field imposed along the direction of the beams 14-30 permits continuous operation in the presence of an adequate gas supply. FIG. 4 illustrates an embodiment of a plasma processing system where gas is supplied through gas inlets 80 for the formation of local plasma regions 32-48 of the locally variable plasma 12. Once the gas supply becomes adequately depleted, the exhaust gas is retrieved through gas outlets 86 allowing the replenishment of a fresh gas supply. In a conventional arrangement, the gases may be continuously replenished and exhausted or may, alternatively, be periodically replaced.

Figure 5:
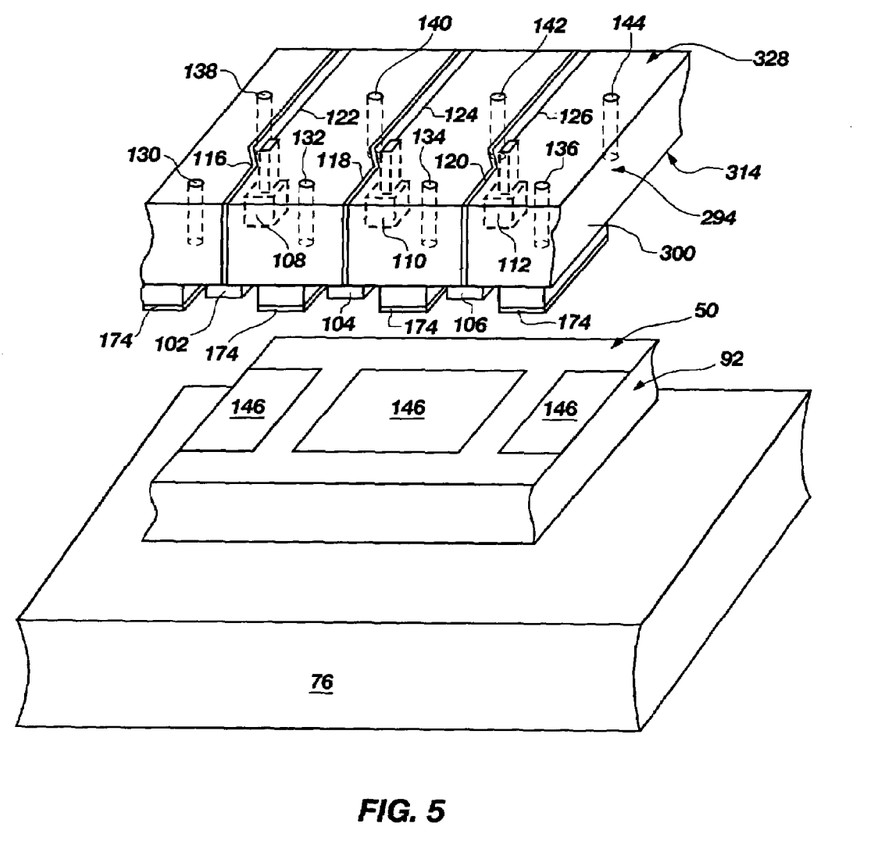
FIG. 5 is a partial cross-sectional view of FIG. 2, in accordance with another embodiment of the present invention illustrated in FIG. 4.

As previously stated, FIG. 2 is a perspective view of a portion of various embodiments of the plasma processing systems of the present invention. With respect to the current embodiment, FIG. 5 illustrates a cross-section A-A of FIG. 2, in accordance with the present embodiment of the present invention. FIG. 4 illustrates a partial cross-sectional area of the portion of the plasma processing system 210 of FIG. 4. Furthermore, the view as illustrated in FIG. 5 is a shortened cross-sectional view in order to enhance greater details. In the present embodiment, the source assembly 294 includes a support structure illustrated as a substrate 300 configured to support and have formed therein the various other features of the source assembly 294. The substrate 300 may be configured as a generally planar semirigid or rigid material which is configured in a generally planar manner with respect to the surface under process 50 of the substrate 92. By way of example and not limitation, the substrate 300 may be configured as a semiconductor material upon which and/or through which the various other elements of the source assembly 294 may be fabricated.

Continuing the present example, the source assembly 294 further includes a plurality of beam generators 102-112 formed upon a first surface 314 of substrate 300. The first surface 314 of substrate 300 is configured for facing the surface under process 50 of the substrate 92. By way of example and not limitation, beam generators 102-112 may be configured as any one of a number of electron sources, examples of which were identified above, acting as field emitter elements.

Each of the beam generators 102-112 may be individually selectable and variably controllable through interconnects 116-126 for individually controlling each of the corresponding beam generators 102-112. While the present illustration depicts interconnects 116-126 passing through the substrate 300 and routed on a second surface 328 of substrate 300, such interconnects may be preferably routed on an internal layer within substrate 300 as fabricated according to conventional semiconductor wafer processing techniques. While the present example illustrates routing on a side of the substrate 300 opposing the side on which the beam generators 102-112 are fabricated, such an illustration provides clarity and is not to be considered limiting.

The source assembly 294 further includes a grid 174 which functions as an electrically conductive plate from which an electrical potential may be generated to accelerate the electrons emitted from the beam generators 102-112 and to protect the tips of the beam generators from damage. The grid 174, in one embodiment, is a continuous grid maintained at a continuous potential across the continuous grid structure. The potential maintained between the grid 174 and a plate 76 induces electron flow from the beam generators 102-112 toward the surface under process 50. In other embodiments, grid 174 may be configured as a plurality of discretely configured elements that are configured to exhibit discretely controllable potentials with respect to plate 76. As illustrated with reference to FIG. 5, the grid 174 is spatially configured between the beam generators 102-112 and the surface under process 50 to induce electron movement and protect the beam generators from damage. As illustrated, the electrical potential creating a field generated between grid 174 and plate 76 induces directionality of electrons directed toward the surface under process 50.

In addition to the specific interconnects for discretely controlling one or more of the beam generators 102-112, the source assembly 294 may further include one or more, such as an array, of openings 130-144 for functioning as gas inlets and/or gas outlets for use in the formation of plasma. In one exemplary embodiment, one or more openings 130-144 configured as gas inlets and/or gas outlets may be fabricated using mechanical, chemical and/or other means for the formation of openings for the passage of gas or gas reactants therethrough. Openings 130-144 may comprise small, even microscopic openings.

The plasma processing system 210 (FIG. 4) further includes, as illustrated in FIG. 5, the plate 76 for providing both mechanical support for the substrate 92 and electrically conductive plate for cooperatively inducing an electrical field for directing the generated plasma toward the surface under process 50 of the substrate 92. By way of example and not limitation, substrate 92 may be configured as a semiconductor wafer undergoing one or more manufacturing processes and may have manufactured thereon one or more integrated circuits 146.

Figure 6:
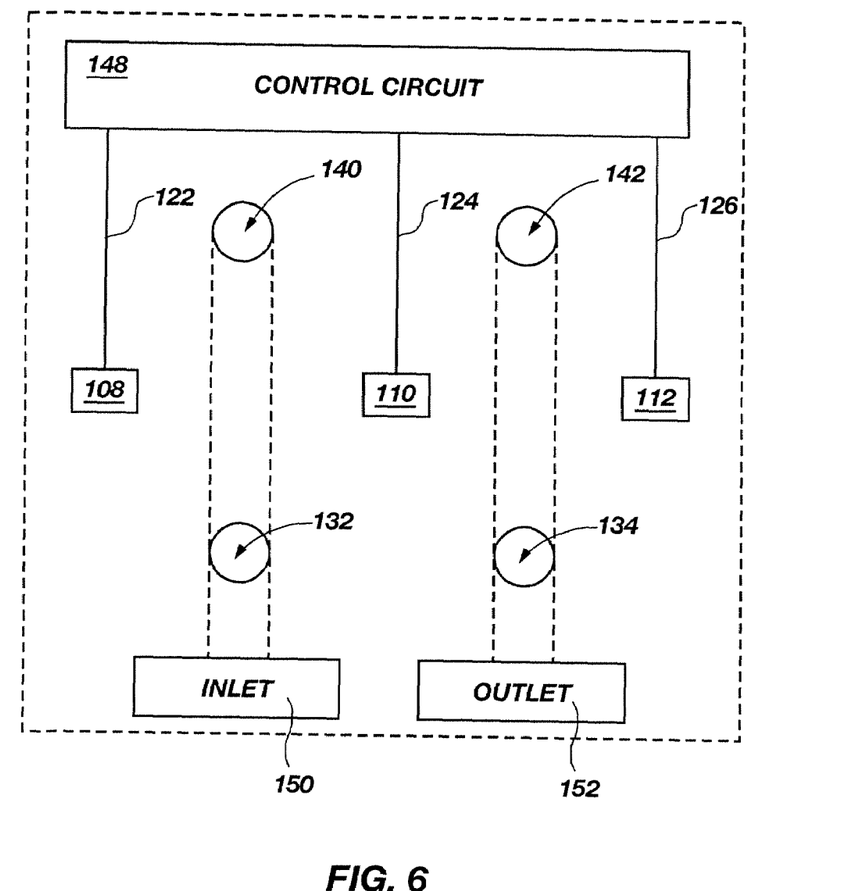
FIG. 6 is a simplified plan view for controlling portions of the plasma processing system, in accordance with an embodiment of the present invention.

FIG. 6 illustrates is a diagram of a portion of the plasma processing system 210 (FIGS. 4 and 5), in accordance with an embodiment of the present invention. By way of example and not limitation, a plurality of beam generators 108-112 are coupled via interconnects 122-126 to a control circuit 148 for individually controlling the beam generators 108-112. FIG. 6 also illustrates an embodiment of the present invention which includes one or more openings for the passing of reactive gases therethrough. In one embodiment of the present invention, gases pass through an inlet 150 to one or more openings 132, 140 for the generation of plasma in the presence of electrons generated by one or more beam generators 108-112. In yet another embodiment of the present invention, an outlet 152 passes exhaust gases therethrough through one or more openings 134, 142.

Although the foregoing description contains many specifics, these should not be construed as limiting the scope of the present invention, but merely as providing illustrations of some of the preferred and exemplary embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A plasma processing system, comprising:
a source assembly including a plurality of beam generators arranged on a common surface of a source assembly substrate surface facing a surface under process of a single substrate;
an electrically conductive grid alternatingly spatially arranged with the plurality of beam generators along the common surface of the source assembly substrate, the electrically conductive grid further arranged between the plurality of beam generators and the surface under process of the single substrate; and
a control circuit coupled to each of the plurality of beam generators, the control circuit configured to independently regulate at least a portion of the plurality of beam generators.

2. The plasma processing system of claim 1, wherein the plurality of beam generators are configured as electron beam generators.

3. The plasma processing system of claim 2, wherein the electron beam generators are configured as one of hollow cathode emitters, single-walled carbon nanotubes, multi-walled carbon nanotubes, boron carbon nitride nanotubes, AlN nanoneedles and ZnO single crystal microtubes.

4. The plasma processing system of claim 1, wherein the plurality of beam generators are spatially configured in a spatial array for spatially extending across at least a major portion of the surface under process of a substrate.

5. The plasma processing system of claim 1, wherein the source assembly is further configured with one or more openings formed therein for routing gas therethrough for generating plasma.

6. The plasma processing system of claim 5, wherein the one or more openings are configured as gas inlets for routing gas toward the plurality of beam generators.

7. The plasma processing system of claim 5, wherein the one or more openings are configured as gas outlets for routing gas away from the plurality of beam generators.

8. The plasma processing system of claim 5, wherein a first portion of the one or more openings are configured as gas inlets for routing gas toward the plurality of beam generators and a second portion of the one or more openings are configured as gas outlets for routing gas away from the plurality of beam generators.

9. The plasma processing system of claim 1, further comprising a potential generator electrically coupled to the electrically conductive grid to form an electrical field across the single substrate.

10. The plasma processing system of claim 1, wherein the control circuit is structured to independently control the at least a portion of the plurality of beam generators to form a relatively uniform plasma across the single substrate.

11. The plasma processing system of claim 1, wherein the control circuit is structured to independently control the at least a portion of the plurality of beam generators to form a differential plasma across the single substrate.

12. A method for generating plasma, comprising:
introducing a process gas into an area above a surface under process of a substrate;
locally controlling each of a plurality of beam generators directed at the process gas, the plurality of beam generators configured to independently emit electrons;
forming a potential between an electrically conductive grid alternatingly spatially arranged with the plurality of beam generators along a common surface of a source assembly substrate, the electrically conductive grid further arranged between the plurality of beam generators and a plate having the surface under process of the substrate therebetween; and
converting at least a portion of the process gas to a plasma according to the electrons emitted from the plurality of beam generators.

13. The method of claim 12, wherein the plurality of beam generators are configured as electron beam generators according one of hollow cathode emitters, single-walled carbon nanotubes, multi-walled carbon nanotubes, boron carbon nitride nanotubes, AlN nanoneedles and ZnO single crystal microtubes.

14. The method of claim 12, further comprising spatially arranging the plurality of beam generators in an array orientation spatially across at least a major portion of the surface under process of the single substrate.

15. The method of claim 14, wherein introducing a process gas comprises introducing a process gas spatially across at least a portion of the array of the plurality of beam generators.

16. The method of claim 14, further comprising exhausting process gas spatially across at least a portion of the array of the plurality of beam generators.

17. The method of claim 12, wherein the locally controlling each of a plurality of beam generators includes locally controlling each of a plurality of beam generators to form a relatively uniform plasma across the surface under process of the single substrate.

18. The method of claim 12, wherein the locally controlling each of a plurality of beam generators includes locally controlling each of a plurality of beam generators to form a differential plasma across the surface under process of the single substrate.

19. A method for treating a surface of a single substrate, comprising:
   independently controlling according to a profile an array of electron beam generators for performing a plasma process on the surface of the single substrate;
   forming a potential between an electrically conductive grid alternatingly spatially arranged with the plurality of beam generators along a common surface of a source assembly substrate, the electrically conductive grid further arranged between the array of electron beam generators and a plate having the surface of the single substrate therebetween;
   introducing a process gas into an area above the surface of the single substrate; converting at least a portion of the process gas into a plasma; and processing the surface of the single substrate with the plasma.

20. The method of claim 19, wherein independently controlling includes adjusting an electron flow from each of the array of electron beam generators.

21. The method of claim 19, wherein the profile is determined to result in a uniform process across a majority of the surface of the single substrate.

22. The method of claim 19, wherein the profile is determined to result in a non-uniform process across a majority of the surface of the single substrate.

23. The method of claim 19, wherein introducing the process gas comprises introducing the process gas interstitially among at least a portion of the array of electron beam generators.

24. The method of claim 19, further comprising interstitially exhausting among at least a portion of the array of electron beam generators at least a portion of the process gas in order to replenish the process gas.

25. The method of claim 19, wherein the array of electron beam generators configured as one of hollow cathode emitters, single-walled carbon nanotubes, multi-walled carbon nanotubes, boron carbon nitride nanotubes, AlN nanoneedles and ZnO single crystal microtubes.

* * * * *

UNITED STATES PATENT AND TRADEMARK OFFICE
CERTIFICATE OF CORRECTION

| | |
|---|---|
| PATENT NO. | : 7,262,555 B2 |
| APPLICATION NO. | : 11/083433 |
| DATED | : August 28, 2007 |
| INVENTOR(S) | : Rueger et al. |

Page 1 of 1

It is certified that error appears in the above-identified patent and that said Letters Patent is hereby corrected as shown below:

In column 10, line 67, in Claim 13, after "according" insert -- to --.

Signed and Sealed this

Thirteenth Day of November, 2007

JON W. DUDAS
*Director of the United States Patent and Trademark Office*